(12) United States Patent
Lin

(10) Patent No.: US 7,638,714 B2
(45) Date of Patent: Dec. 29, 2009

(54) STRUCTURE AND MANUFACTURING METHOD OF SUBSTRATE BOARD

(76) Inventor: Yu-Hsueh Lin, 5F, No. 18, Lane 22, Wunjhou St., Da-An District, Taipei City (TW)

(*) Notice: Subject to any disclaimer, the term of this patent is extended or adjusted under 35 U.S.C. 154(b) by 196 days.

(21) Appl. No.: 11/969,485

(22) Filed: Jan. 4, 2008

(65) Prior Publication Data
US 2009/0116193 A1    May 7, 2009

(30) Foreign Application Priority Data
Nov. 6, 2007    (TW) .............................. 96141806 A

(51) Int. Cl.
*H05K 1/00* (2006.01)
(52) U.S. Cl. .................. 174/252; 174/251; 174/253; 361/702; 361/704; 361/709; 361/710; 361/711
(58) Field of Classification Search .............. 174/524, 174/526, 546, 547, 548, 255–259, 250–253; 361/700–713, 720, 687, 688, 696, 697; 428/209, 428/210
See application file for complete search history.

(56) References Cited
U.S. PATENT DOCUMENTS

| | | | | |
|---|---|---|---|---|
| 4,876,120 A | * | 10/1989 | Belke et al. | 428/1.54 |
| 4,963,701 A | * | 10/1990 | Yasumoto et al. | 174/256 |
| 5,224,017 A | * | 6/1993 | Martin | 361/707 |
| 7,358,665 B2 | * | 4/2008 | Yu et al. | 313/512 |
| 2004/0091011 A1 | * | 5/2004 | Liu | 372/46 |
| 2005/0019535 A1 | * | 1/2005 | Vasoya et al. | 428/209 |
| 2005/0019541 A1 | * | 1/2005 | Vasoya et al. | 428/297.4 |
| 2006/0065421 A1 | * | 3/2006 | Arai et al. | 174/52.2 |
| 2006/0192194 A1 | * | 8/2006 | Erchak et al. | 257/13 |
| 2008/0116809 A1 | * | 5/2008 | Park | 315/116 |
| 2008/0298021 A1 | * | 12/2008 | Ali et al. | 361/705 |
| 2009/0027857 A1 | * | 1/2009 | Dean et al. | 361/709 |

\* cited by examiner

*Primary Examiner*—Dean A. Reichard
*Assistant Examiner*—Hoa C Nguyen
(74) *Attorney, Agent, or Firm*—Rosenberg, Klein & Lee

(57) ABSTRACT

A method for manufacturing a substrate board with high efficiency of heat conduction and electrical isolation is disclosed. The method comprises the steps of: providing a substrate layer with an arrangement surface and a heat-dissipating surface; executing an anodic treatment on the arrangement surface and the heat-dissipating surface to respectively form a first anodic treatment layer and a second anodic treatment layer; forming a heat conduction and electrical isolation layer on the second anodic treatment layer; and forming a diamond like carbon (DLC) layer on the heat conduction and electrical isolation layer. The heat expansion coefficient of the substrate layer is greater than that of the second anodic treatment layer, the heat conduction and electrical isolation layer, and the DLC layer in turn.

19 Claims, 4 Drawing Sheets

… (1)

STRUCTURE AND MANUFACTURING METHOD OF SUBSTRATE BOARD

FIELD OF THE INVENTION

The present invention relates to a technology of manufacturing a substrate board, and more particularly to a technology of manufacturing a substrate board with high efficiency of heat conduction and electrical isolation.

BACKGROUND OF THE INVENTION

Among all electronic devices existed in the present, there are many electronic working components assembled therein, such as micro processors, semiconductor chips or light emitting diodes (LEDs), etc., to execute preset assignments. In the practice, it is usually necessary to print a printed circuit on a substrate board, and deposit the electronic components on the printed circuit, so as to manufacture a printed circuit board.

Meanwhile, when the electronic components execute the preset assignments, it is unavoidable to release heat energy. In the most conditions, if heat energy could not be dissipated out of the PCB, it not only influences the normal operations of the electronic components, but also makes the PCB be damaged. Therefore, among many designs of the substrate boards, the efficiency of heat dissipating is usually taken into consideration.

Furthermore, when forming the printed circuits, especially for the integrated type of printed circuits, it is usually necessary to consider electrical isolation conditions between the printed circuits and the electronic components. Under the consideration of safety, the electrical isolation conditions usually need to meet a principle of preventing the printed circuits and the electronic components from being damaged under a breaking voltage.

Under the above background, a printed circuit board with high efficiency of heat conduction has been disclosed in a patent published in Taiwan with the publication number of 200626031 (the '031 patent). Thus, the detail description of a representative prior art with reference to the '031 patent is disclosed as follows.

Please refer to FIG. 1, which illustrates a structure of a printed circuit board in accordance with the prior art with reference to the '031 patent. As shown in FIG. 1, a printed circuit board 1 comprises a substrate board 11, a printed circuit 12, a protection layer 13, a solder 14 and a semiconductor chip 15. The substrate board 11 is composed of a substrate layer 111, an electrical isolation layer 112 and a heat conduction and electrical isolation layer 113. The electrical isolation layer 112 covers one surface of the substrate layer 111, the heat conduction and electrical isolation layer 113 further covers the electrical isolation layer 112. In the 031' patent, it is clearly mentioned that the isolation layer 112 is composed of a high polymer material, such as Epoxy.

The printed circuit 12 is printed on the heat conduction and electrical isolation layer 113, the protection layer 13 covers the isolation layer 112, and the semiconductor chip 15 is electrically connected to the printed circuit 12 via the solder 14. In practice, the protection layer 13 can be etched to form an opening for soldering, or the solder 14 can melt the protection layer 13 to form the opening when it is provided in a high temperature, so that the semiconductor can be electrically connected to the printed circuit 12 via the solder 14.

People skilled in ordinary arts can easily realize that, in the technology as mentioned above, although that the electrical isolation layer 112 composed of the high polymer material can provide good performance of electrical isolation; however, heat energy release from the semiconductor chip just can be slowly transferred to the substrate layer 111 via electrical isolation layer 112 due to that the heat conduction performance of the electrical isolation layer 112, composed of high polymer material, is very poor.

For Example, when the substrate layer 111 is an aluminum substrate board, the electrical layer 112 is made of Epoxy, and the heat conduction and electrical isolation layer 113 is made of a diamond like carbon (DLC) material, the heat conduction coefficients of all members are listed as follows: the heat conduction coefficient of the substrate layer 111 is approximate to 239 W/m·K (Watt, per meter, per temperature degree in Kelvin); the heat conduction coefficient of the electrical isolation layer 112 is approximate to 0.2~4.0 W/m·K; and the heat conduction coefficient of the heat conduction and electrical isolation layer 113 is approximate to 2000 W/m·K. Therefore, heat energy released from the semiconductor chip 15 can be quickly transferred from the substrate layer 111 to the electrical isolation layer 112, but it transfers to the heat conduction and electrical isolation layer 113 very slowly due to that the heat conduction of the electrical isolation layer 112 is much less than that of other members. Thus, the electrical isolation will become another new relative heat source.

Following above description, when the substrate layer 111 is an aluminum substrate board, the electrical layer 112 is made of Epoxy, and the heat conduction and electrical isolation layer 113 is made of a diamond like carbon (DLC) material, the heat expansion coefficients of all members are listed as follows: the heat expansion coefficient of the substrate layer 111 is approximate to $23.8 \times 10^{-6}/°$ C.; the heat expansion coefficient of the electrical isolation layer 112 is approximate to $50~60 \times 10^{-6}/°$ C.; and the heat expansion coefficient of the heat conduction and electrical isolation layer 113 is approximate to $1.5 \times 10^{-6}/°$ C.

From above data, we can clearly know that the heat expansion coefficient of the substrate layer 111 is only 40%~48% of that of the electrical isolation layer 112, but the heat expansion coefficient of the electrical isolation layer 112 is 33~40 times of that of the heat conduction and electrical isolation layer 113. Viewing from all processes of manufacturing the substrate board 11, it is obvious that a great residual thermal stress will be generated between the electrical isolation layer 112 and the heat conduction and electrical isolation layer 113 after the substrate board 11 cooling down. Therefore, a phenomenon of peeling will be generated between the heat conduction and electrical isolation layer 113 and the electrical isolation layer 112.

Nevertheless, following above description, due to that the isolation layer 112 becomes another new relative heat source neighbor to the semiconductor chip 15, the overall heat conduction performance of the substrate board 11, that can dissipate heat energy released from the semiconductor ship 15, will become poorer and poorer.

SUMMARY OF THE INVENTION

From above description, in the prior arts, it is obvious that the heat conduction performance of the isolation layer is poor, and the variation of heat expansion coefficients between the substrate layer, the electrical isolation layer and the heat conduction and electrical isolation layer, is too great. Therefore, the substrate board provided in prior art generally exists the shortcomings and problems as follows. First, the great the variation of heat expansion coefficients of the members within the substrate board generate great thermal stress within the substrate board. Second, the overall heat conduction performance of the substrate layer is poor.

The primary objective of the present invention provides a method for manufacturing substrate board. In the method, a first anodic treatment layer and a second anodic treatment layer, both being composed of a metallic oxide, are provided to replace the isolation layer composed of the high polymer material in prior art. Thus, the overall performance of heat conduction can be obviously upgraded via the characteristic of that the heat conduction coefficient of the first anodic treatment layer and the second anodic treatment layer in the present invention is greater than that of the isolation layer in the prior art.

The secondary objective of the present invention provides a method for manufacturing a substrate board. Through combining the considerations of forming sequences and the heat expansion characteristics of the materials, the residual thermal stress within the substrate board will be obviously reduced after all manufacturing processes are completed.

Another objective of the present invention provides a method for manufacturing a substrate board, wherein some structures neighbor to each other are respectively composed of a metallic oxide and a metallic nitride of the same metal, so as to make the bonding relation between the structures neighbor to each other become well.

Means of the present invention for solving the problems as mentioned above provides a method for manufacturing a substrate board with high efficiency of heat conduction and electrical isolation. The substrate board comprises the steps of: manufacturing a substrate layer with an arrangement surface and a heat-dissipating surface; executing an anodic treatment on the arrangement surface and the heat-dissipating surface to respectively form a first anodic treatment layer and a second anodic treatment layer; forming a heat conduction and electrical isolation layer on the second anodic treatment layer; and a forming a diamond like carbon (DLC) layer on the heat conduction and electrical isolation layer. The heat expansion coefficient of the substrate layer is greater than that of the second anodic treatment layer; the heat expansion coefficient of the second anodic treatment layer is greater than that of the heat conduction and electrical isolation layer; and the heat expansion coefficient of the heat conduction and electrical isolation layer is greater than that of the (DLC) layer.

In the preferred embodiments of the present invention, the second anodic treatment layer is composed of a metallic oxide of a metal, and the heat conduction and electrical isolation layer is made of a metallic nitride of the same metal. Therefore, heat conduction and electrical isolation layer can be well bonded with the second anodic treatment layer. The heat conduction and electrical isolation layer is formed on the second anodic treatment layer via executing one of a vacuum-sputter treatment, a plasma vapor deposition (PVD) treatment, a chemical vapor deposition (CVD) treatment, and an ion implantation treatment. Additionally, the DLC layer is formed on the heat conduction and electrical isolation layer via executing one of a plasma-enhanced chemical vapor deposition (PECVD) treatment, a PVD treatment and a CVD treatment.

From above description, comparing with the prior arts, in the present invention, due to that the heat conduction coefficient of the first anodic treatment layer and the second anodic treatment layer in the present invention is greater than that of the isolation layer in the prior art, the overall performance of heat conduction can be obviously upgraded.

Meanwhile, the actual forming sequences are forming first anodic treatment layer and the second anodic treatment layer, forming the heat conduction and electrical isolation layer, and the DLC layer; moreover, the heat expansion coefficient of the second anodic treatment layer is greater than that of the heat conduction and electrical isolation layer; and the heat expansion coefficient of the heat conduction and electrical isolation layer is greater than that of the (DLC) layer. Therefore, the residual thermal stress within the substrate board can be reduced after all manufacturing processes are completed. Moreover, the second anodic treatment layer is composed of a metallic oxide of a metal, and the heat conduction and electrical isolation layer is made of a metallic nitride of the same metal, so that the heat conduction and electrical isolation layer can be well bonded with the second anodic treatment layer. Basing on above factors, it is not easily to generate the phenomenon of peeling when cutting or trimming the substrate board of the present invention, so as to increase the yield rate of substrate board cutting.

The characteristics, and the preferred embodiment of this invention are described with relative figures as follows.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The technology of manufacturing the substrate board as provided in accordance with the present invention can be widely use for manufacturing many kinds of substrate board to arrange circuits and deposit electronic components, the combined applications are too numerous to be enumerated and described, so that only two preferred embodiments are disclosed as follows for representation.

Figure 1:
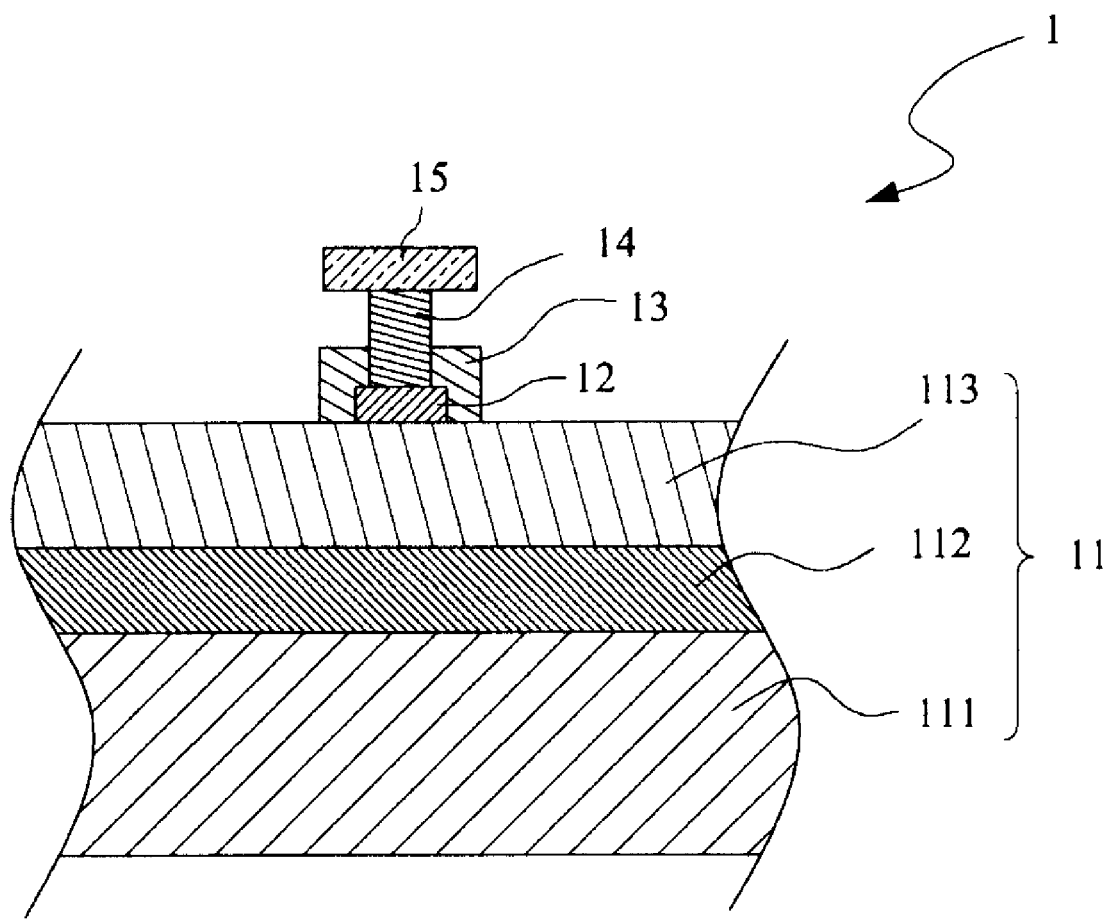
FIG. 1 illustrates a structure of a printed circuit board in accordance with the prior art.
Figure 2:
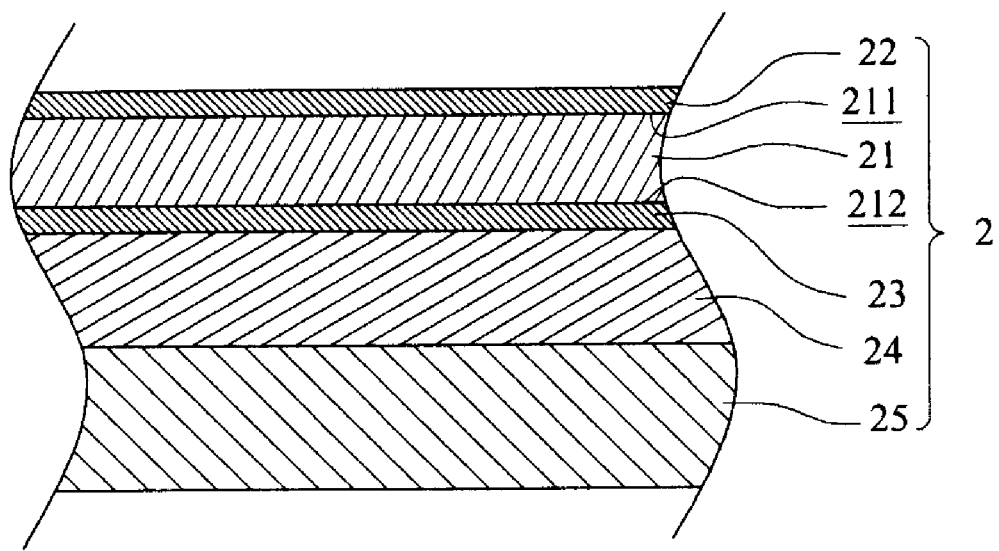
FIG. 2 illustrates a structure of a substrate board in accordance with a first embodiment of the present invention.
Figure 3:
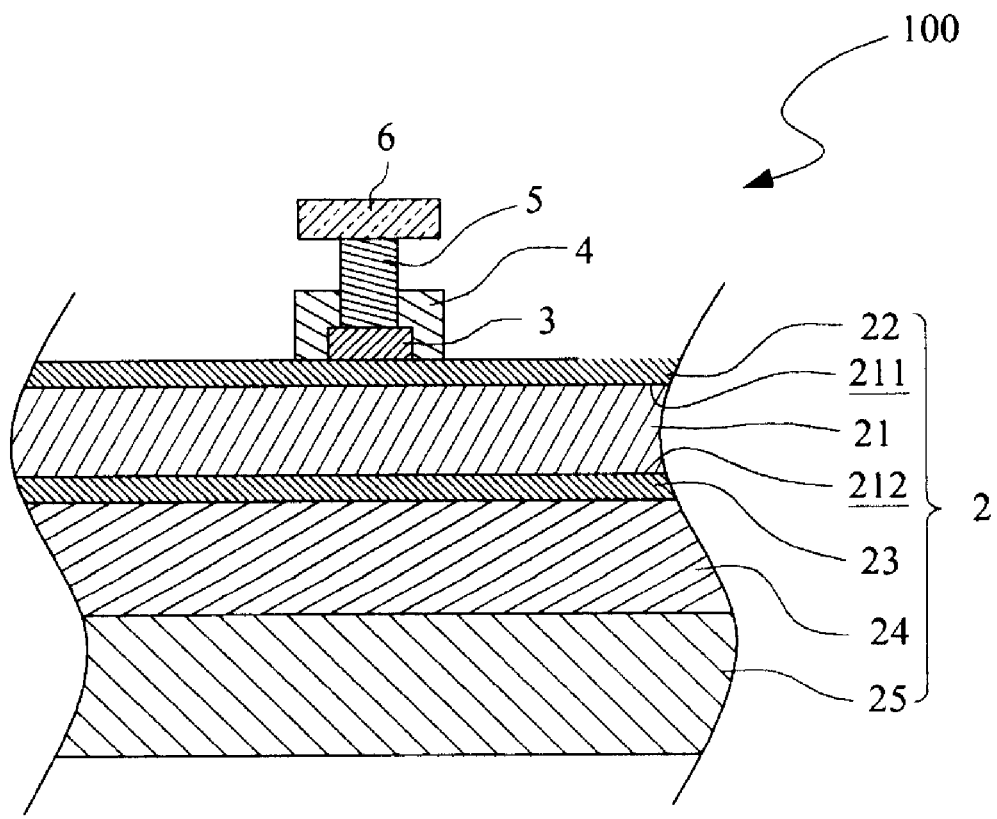
FIG. 3 illustrates the substrate board in accordance with the first embodiment being capable of manufacturing a printed circuit board.

Please refer to FIG. 2 and FIG. 3, wherein FIG. 2 illustrates a structure of a substrate board in accordance with a first embodiment of the present invention, and FIG. 3 illustrates the substrate board in accordance with the first embodiment being capable of manufacturing a printed circuit board. As shown in the drawings, a substrate board 2 comprises five structural layers, including a substrate layer 21, a first anodic treatment layer 22, a second anodic treatment layer 23, a heat conduction and electrical isolation layer 24, and a diamond like carbon (DLC) layer 25.

The substrate layer 21 has an arrangement surface 211 and a heat-dissipating surface 212 opposite to the arrangement surface 211. The first anodic treatment layer 22 covers the arrangement surface 211 of the substrate layer 21, the second anodic treatment layer 23 covers the heat-dissipating surface 212 of the substrate layer 21, the heat conduction and electrical isolation layer 24 covers the second anodic treatment layer 23, and the DLC layer 25 covers the heat conduction and electrical isolation layer 24. Furthermore, the heat expansion coefficient of the substrate layer 21 is greater than that of the second anodic treatment layer 23; the heat expansion coefficient of the second anodic treatment layer 23 is greater than that of the heat conduction and electrical isolation layer 24; the heat expansion coefficient of the heat conduction and electrical isolation layer 24 is greater than that of the DLC layer 25.

In real applications, the substrate layer 21 can be made of an aluminum (Al) alloy or a copper (Cu) alloy; the first anodic treatment layer 22 and the second anodic treatment layer 23 can be composed of a metallic oxide; the heat conduction and electrical isolation layer 24 can be composed of beryllium oxide (BeO), silicon nitride ($Si_3N_4$), silicon carbide (SiC), silicon nitride or boron nitride (BN).

Preferably, in the first embodiment, the second anodic treatment layer 23 and the heat conduction and electrical isolation layer 24 are respectively composed of the metallic oxide and a metallic nitride of the same metal. For example, the first anodic treatment layer 22 and the second anodic treatment layer 23 can be composed of aluminum oxide ($Al_2O_3$); the heat conduction and electrical isolation layer 24 is composed of aluminum nitride (AlN). Obviously, under this condition, the heat conduction and electrical isolation layer 24 can be well bonded with the second anodic treatment layer 23.

Moreover, when the substrate layer 21 is made of aluminum, the first anodic treatment layer 22 and the second anodic treatment layer 23 are composed of aluminum oxide ($Al_2O_3$), the heat conduction and electrical isolation layer 24 is composed of aluminum nitride (AlN), the heat expansion coefficients of the mentioned structural layers are actually measured as follows: the heat expansion coefficient of the substrate layer 21 is approximate to $23.8 \times 10^{-6}/°$ C.; the heat expansion coefficient of the second anodic treatment layer 23 is approximate to $8 \times 10^{-6}/°$ C.; the heat expansion coefficient of the heat conduction and electrical isolation layer 24 is approximate to $4.4 \times 10^{-6}/°$ C.; and the heat expansion coefficient of the DLC layer 25 is approximate to $1.5 \times 10^{-6}/°$ C. Obviously, the values of heat expansion coefficients of the mentioned structural layers meet the relation as described in the paragraph [0031].

People skilled in ordinary arts can easily realize that, from the heat expansion coefficient data of any two neighbored structural layers, the heat expansion coefficient of the substrate layer 21 is just 3 times of that of the second anodic treatment layer 23; the heat expansion coefficient of the second anodic treatment layer 23 is just 1.8 times of that of the heat conduction and electrical isolation layer 24; and the heat expansion coefficient of the heat conduction and electrical isolation layer 24 is just 3 times of that of the DLC layer 25.

Comparing with the prior art, in the present invention, the heat expansion coefficients are steadily decreased from the substrate layer 21 to the DLC layer 25, and the variation of heat expansion coefficients between any neighbored structural layers is small enough, with respect to the prior art, to make sure that the residual thermal stresses among the substrate layer 21, the second anodic treatment layer 23, the heat conduction and electrical isolation layer 24, and DLC layer 25 are obviously reduced. Form above description, it can be easily realized that the phenomenon of peeling, i.e., the phenomenon of that any structural layer is apart from the other neighbored structural layer, will not generate so often when cutting the substrate board, so as to increase the yield rate of substrate board cutting.

The substrate board 2 can be applied to be printed with a printed circuit 3, and the printed circuit 3 can be covered with a protection layer 4. Then, a solder 5 can pass through the projection layer 4 to make an electronic component 6 be electrically connected to the printed circuit 3, so as to deposit the electrical component on the substrate board 2. In the first embodiment of the present invention, the electronic component 6 can be a micro processor, a semiconductor chip, an LED, so as to execute preset assignments.

It is obvious that the substrate board 2, the printed circuit 3, the protection layer 4, the solder 5 and the electronic component 6 can form a printed circuit board 100 capable of executing the preset assignments. Due to that the connection relation of the printed circuit 3, the protection layer 4, the solder 5 and the electronic component is the same as or similar to that of the the printed circuit 12, the protection layer 13, the solder 14 and the semiconductor chip 15, the detail description is repeated again in follows.

Nevertheless, with respect to the electronic component 6, the first anodic treatment 22, the second treatment anodic treatment layer 23, the heat conduction layer 24 and the DLC layer 25 can individually or integrally provide an electrical isolation condition.

As shown in FIG. 3, when the electronic component 6 is started and executing a present assignment, heat energy will be generated and transmitted to external environment via the first anodic treatment layer 22, the substrate layer 21, the second anodic treatment layer 23, the heat conduction and electrical isolation layer 24, and the DLC layer 25.

When the substrate layer 21 is made of aluminum, the first anodic treatment layer 22 and the second anodic treatment layer 23 are composed of aluminum oxide ($Al_2O_3$), the heat conduction and electrical isolation layer 24 is composed of aluminum nitride (AlN), the heat conduction coefficients of the mentioned structural layers are actually measured as follows: the heat conduction coefficient of the substrate layer 21 is approximate to 239 W/m·K; the heat conduction coefficient of the second anodic treatment layer 23 is approximate to 28 W/m·K; the heat conduction coefficient of the heat conduction and electrical isolation layer 24 is approximate to 160 W/m·K; and the heat conduction coefficient of the DLC layer 25 is approximate to 2000 W/m·K. Obviously, comparing with the prior art, the substrate board 2 of the present invention really can provide better heat conduction performance.

Nevertheless, the heat conduction performance comparison between the substrate boards made in prior art and the present invention can be verified via the following two testing method. One method is to deposit two LEDs respectively one the substrate boards 11 (prior art) and 2 (present invention) to measure the variation between the brightness and the current; and the other method is to measure the variation between wavelength and current of the emitting light beams respectively emitted from the LEDs deposited on the substrate boards 11 and 2.

When measuring the variation between the brightness and the current, it is able to get a diagram of brightness and current (L-I) curve. From the L-I curve, we can know that the LED deposited on the substrate board 11 is broken just under a current of 350 mA; while the LED deposited on the substrate board 2 is broken under a higher current of 500 mA. The measuring result implies that the heat conduction performance of the substrate board 2 is much better than that of the substrate board 11 due to the reason that the surface temperature of the substrate board 2 is lower, so that the LED deposited on the substrate board 2 can suffer heat energy release under the current of 500 mA.

When measuring the variation the variation between wavelength and current of the emitting light beams, it is able to get a diagram of Wavelength and current (WL-I) curve. From the WL-I curve, we can find that the wavelength of the emitting light beam emitted from the LED deposited on the substrate board 11 is 471.4 nm when the current is 400 mA; while the wavelength of the emitting light beam emitted from the LED deposited on the substrate board 2 is 462.5 nm when the current is 400 mA. Due to that under the same working current, the wavelength of the emitting light beam emitted from the LED deposited on the substrate board 11 is greater than that of the emitting light beam emitted from the LED deposited on the substrate board 2. Therefore, through the "red-shift phenomenon", it can be proven that the surface temperate of the substrate board 11 is higher than that of the substrate board 2.

After reading the above measuring results, it is undoubted that people skilled in ordinary arts can easily make a judgment that the heat conduction performance of the substrate board 2 as provided in the present invention is really better than that of the substrate board 11 as provided in the prior art.

Figure 4:
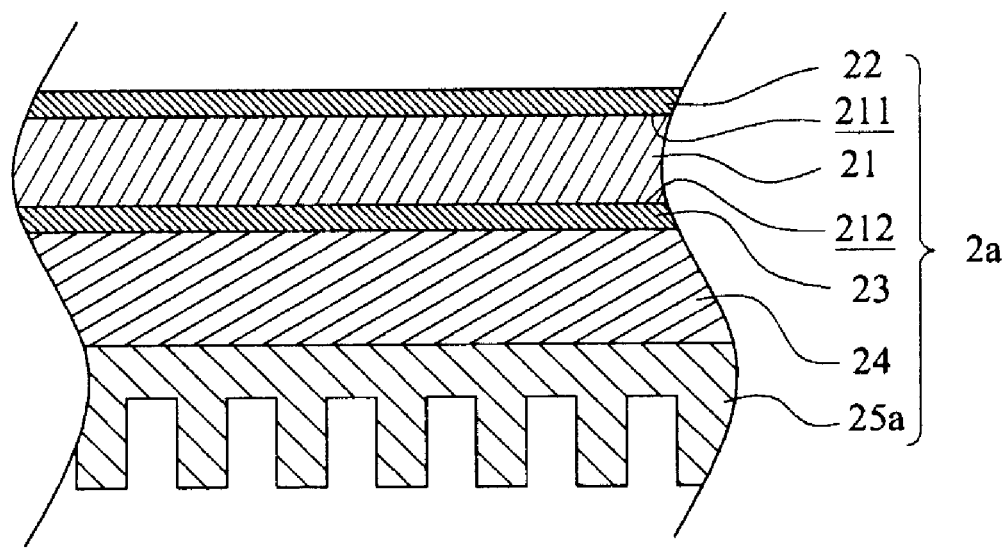
FIG. 4 illustrates a structure of a substrate board in accordance with a second embodiment of the present invention.
Figure 5:
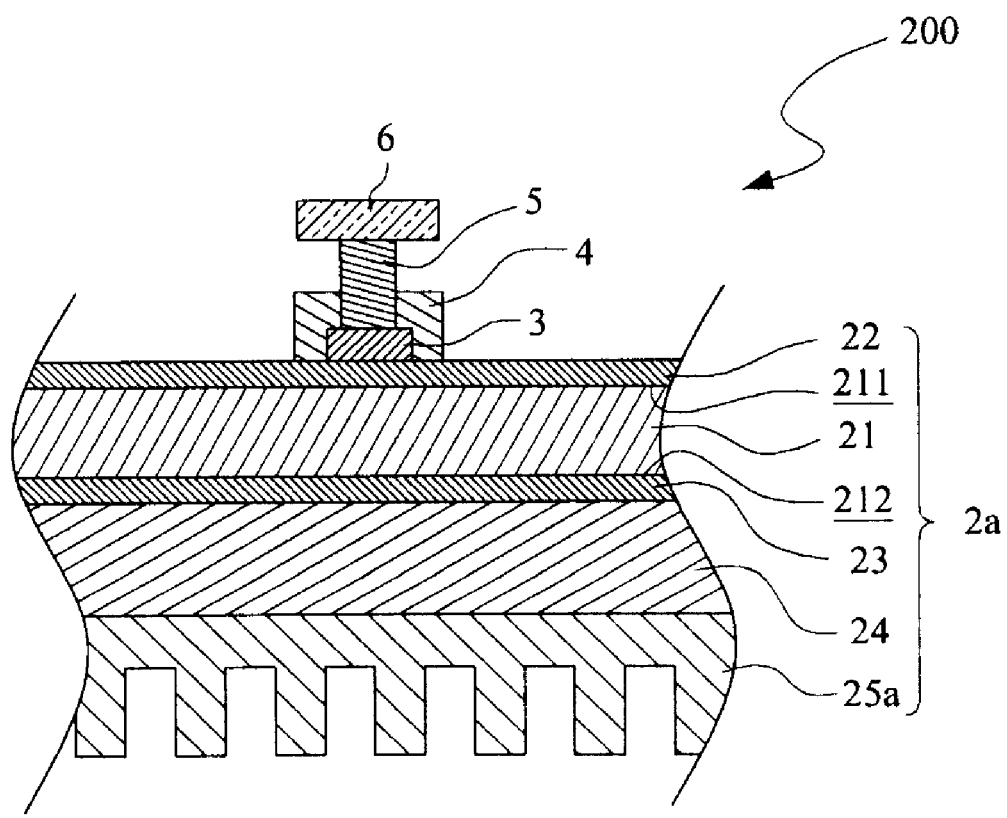
FIG. 5 illustrates the substrate board in accordance with the second embodiment being capable of manufacturing a printed circuit board.

Please go on referring FIG. 4 and FIG. 5, wherein FIG. 4 illustrates a structure of a substrate board in accordance with a second embodiment of the present invention, and FIG. 5 illustrates the substrate board in accordance with the second embodiment being capable of manufacturing a printed circuit board. With the difference from the first embodiment, in the second embodiment, a DLC heat-dissipating fin assembly 25a is applied to replace the DLC layer 25, so that the substrate layer 21, the first anodic treatment layer 22, the second anodic treatment layer 23, the heat conduction and electrical isolation layer 24, and the DLC heat-dissipating fin assembly 25a can form another substrate board 2a. Moreover, the substrate board 2a, the printed circuit 3, the protection layer 4, the solder 5 and the electronic component 6 can form another printed circuit board 200 capable of executing other preset assignments.

Both the above two embodiments can be manufactured by the method as provided in the present invention. The manufacturing processes of the substrate board manufactured in accordance with the second embodiment is more complicated than that of the substrate board manufactured in accordance with the first embodiment, and it is more representative, so that the method for manufacturing the substrate board 2a will be disclosed in detail as follows.

Figure 6:
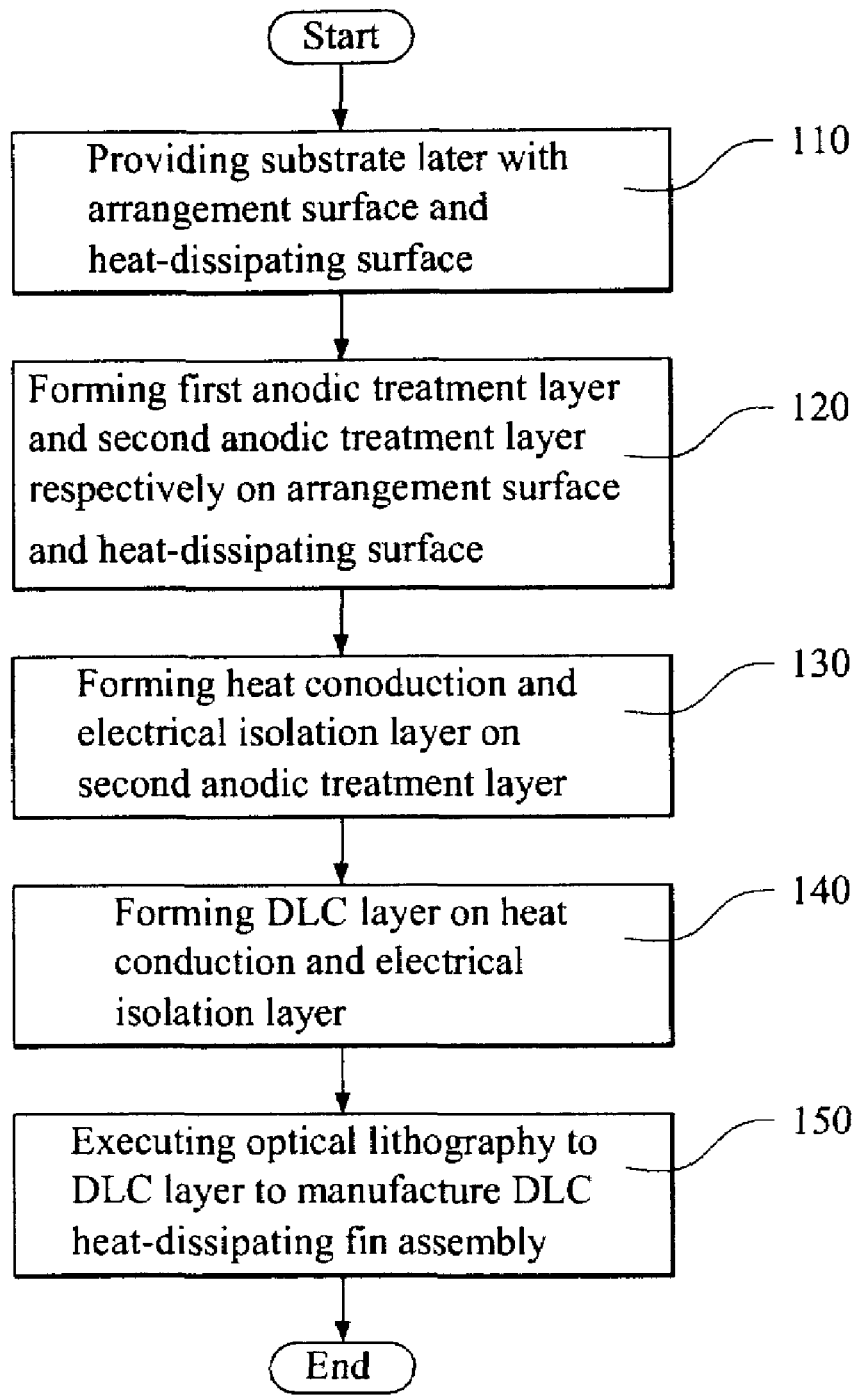
FIG. 6 illustrates a simplified flowchart of manufacturing the substrate board in accordance with the second embodiment of the present invention.

Please refer to FIG. 6, which illustrates a simplified flowchart of manufacturing the substrate board in accordance with the second embodiment of the present invention. At the same time, please refer to FIG. 4 and FIG. 5. The method for manufacturing the substrate board 2a comprises the steps as follows. First, provide a substrate layer 21 having the arrangement surface 211 and the heat-dissipating surface 212 (step 110), and execute an anodic treatment to the substrate layer 21, so as to form the first anodic treatment layer 22 and the second anodic treatment layer 23 respectively on the arrangement surface 211 and the heat-dissipating surface 212 (step 120).

Following up, execute a vacuum-sputter treatment, a plasma vapor deposition (PVD) treatment, a chemical vapor deposition (CVD) treatment, or an ion implantation treatment, so as to form the heat conduction and electrical isolation layer 24 on the second anodic treatment layer 23 (step 130).

Hereafter, execute a plasma-enhanced chemical vapor deposition (PECVD) treatment, a PVD treatment or a CVD treatment, so as to form the DLC layer 25 on the heat conduction and electrical isolation layer 24. Finally, execute an optical lithography to make the DLC layer 25 become the DLC heat-dissipating fin assembly 25a.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A substrate board being applied to arrange at least one working electronic component, which generates a heat energy when working, also being applied to provide an electrical isolation condition for the working electronic component, and the substrate board comprising:
   a substrate layer having an arrangement surface and a heat-dissipating surface;
   a first anodic treatment layer covering the arrangement surface for arranging the electronic working component;
   a second anodic treatment layer covering the heat-dissipating surface for conducting the heat energy;
   a heat conduction and electrical isolation layer covering the second anodic treatment layer for conducting the heat energy; and
   a diamond like carbon (DLC) layer covering the heat conduction and electrical isolation layer for dissipating the heat energy;
   wherein the heat expansion coefficient of the substrate layer is greater than that of the second anodic treatment layer; the heat expansion coefficient of the second anodic treatment layer is greater than that of the heat conduction and electrical isolation layer; and the heat expansion coefficient of the heat conduction and electrical isolation layer is greater than that of the DLC layer.

2. The substrate board as claimed in claim 1, wherein the first anodic treatment layer is laid out with a printed circuit for arranging the electronic component.

3. The substrate board as claimed in claim 1, wherein the substrate layer is composed of one of an aluminum alloy and a copper alloy.

4. The substrate board as claimed in claim 1, wherein the second anodic treatment layer is composed of a metallic oxide of a metal, so as to provide the electrical isolation condition.

5. The substrate board as claimed in claim 4, wherein the metal is aluminum (Al), and the metallic oxide is aluminum oxide ($Al_2O_3$).

6. The substrate board as claimed in claim 4, wherein the heat conduction and electrical isolation layer is composed of a metallic nitride of the metal.

7. The substrate board as claimed in claim 6, wherein the metal is aluminum (Al), and the metallic nitride is aluminum nitride (AlN).

8. The substrate board as claimed in claim 1, wherein the heat conduction and electrical isolation layer is composed of one of beryllium oxide (BeO), silicon carbide (SiC), silicon nitride ($Si_3N_4$) and boron nitride (BN).

9. The substrate board as claimed in claim 1, wherein the DLC layer is a DLC heat-dissipating fin assembly.

10. A method for manufacturing the substrate board as claimed in claim 1, comprising the steps of:
    (a) providing the substrate layer;
    (b) executing an anodic treatment to the substrate layer, so as to form the first anodic treatment layer and the second anodic treatment layer respectively on the arrangement surface and the heat-dissipating surface;
    (c) forming the heat conduction and electrical isolation layer on the DLC layer; and (d) forming the DLC layer on the heat conduction and electrical isolation layer;

wherein the heat conduction coefficient of the second anodic treatment layer is less than that of the heat conduction and electrical isolation layer; the heat conduction coefficient of the heat conduction and electrical isolation layer is less than that of the DLC layer.

11. The method as claimed in claimed 10, after the step (d), further comprising a step (f) of executing an optical lithography to make the DLC layer become a DLC heat-dissipating-fin assembly.

12. The method as claimed in claimed 10, wherein the heat conduction and electrical isolation layer is formed on the second anodic treatment layer via executing one of a vacuum-sputter treatment, a plasma vapor deposition (PVD) treatment, a chemical vapor deposition (CVD) treatment, and an ion implantation treatment.

13. The method as claimed in claimed 10, wherein the DLC layer is formed on the heat conduction and electrical isolation layer via executing one of a plasma-enhanced chemical vapor deposition (PECVD) treatment, a PVD treatment and a CVD treatment.

14. The method as claimed in claimed 10, wherein the substrate layer is composed of one of an aluminum alloy and a copper alloy.

15. The method as claimed in claimed 10, wherein the second anodic treatment layer is composed of a metallic oxide of a metal.

16. The method as claimed in claimed 15, wherein the metal is aluminum (Al), and the metallic oxide is aluminum oxide ($Al_2O_3$).

17. The method as claimed in claimed 15, wherein the heat conduction and electrical isolation layer is composed of a metallic nitride of the metal.

18. The method as claimed in claimed 17, wherein the metal is aluminum (Al), and the metallic nitride is aluminum nitride (AlN).

19. The method as claimed in claimed 10, wherein the heat conduction and electrical isolation layer is composed of one of beryllium oxide (BeO), silicon carbide (SiC), silicon nitride ($Si_3N_4$) and boron nitride (BN).

* * * * *